United States Patent
Pelton et al.

(10) Patent No.: US 11,144,286 B2
(45) Date of Patent: Oct. 12, 2021

(54) GENERATING SYNCHRONOUS DIGITAL CIRCUITS FROM SOURCE CODE CONSTRUCTS THAT MAP TO CIRCUIT IMPLEMENTATIONS

(71) Applicant: MICROSOFT TECHNOLOGY LICENSING, LLC, Redmond, WA (US)

(72) Inventors: Blake D. Pelton, Redmond, WA (US); Adrian Michael Caulfield, Woodinville, WA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 85 days.

(21) Appl. No.: 16/247,226

(22) Filed: Jan. 14, 2019

(65) Prior Publication Data
US 2020/0225920 A1    Jul. 16, 2020

(51) Int. Cl.
    G06F 8/41     (2018.01)
    G06F 30/34    (2020.01)
    G06F 8/30     (2018.01)

(52) U.S. Cl.
    CPC ............ *G06F 8/41* (2013.01); *G06F 8/314* (2013.01); *G06F 30/34* (2020.01)

(58) Field of Classification Search
    CPC ............ G06F 8/41; G06F 8/314; G06F 30/34
    See application file for complete search history.

(56) References Cited

U.S. PATENT DOCUMENTS 5,343,554 A    8/1994  Koza et al.
5,416,719 A    5/1995  Pribetich
(Continued)

FOREIGN PATENT DOCUMENTS

WO    2016094012 A1    6/2016
WO    2017084104 A1    5/2017

OTHER PUBLICATIONS

Boris Steinberg et al., "Automatic High-level Programs Mapping onto Programmable Architectures," 2015 [retrieved on Jun. 17, 2021], International Conference on Parallel Computing Technologies, Lecture Notes in Computer Science, vol. 9251, pp. 474-485, downloaded from <url>:https://link.springer.com. (Year: 2015).*

(Continued)

*Primary Examiner* — S. Sough
*Assistant Examiner* — Stephen D Berman
(74) *Attorney, Agent, or Firm* — Newport IP, LLC; Jacob P. Rohwer

(57) ABSTRACT

A multi-threaded imperative programming language includes language constructs that map to circuit implementations. The constructs can include a condition statement that enables a thread in a hardware pipeline to wait for a specified condition to occur, identify the start and end of a portion of source code instructions that are to be executed atomically, or indicate that a read-modify-write memory operation is to be performed atomically. Source code that includes one or more constructs mapping to a circuit implementation can be compiled to generate a circuit description. The circuit description can be expressed using hardware description language (HDL), for instance. The circuit description can, in turn, be used to generate a synchronous digital circuit that includes the circuit implementation. For example, HDL might be utilized to generate an FPGA image or bitstream that can be utilized to program an FPGA that includes the circuit implementation associate with the language construct.

20 Claims, 8 Drawing Sheets

(56) References Cited

U.S. PATENT DOCUMENTS

| | | |
|---|---|---|
| 5,642,304 A | 6/1997 | Simpson |
| 5,761,483 A | 6/1998 | Trimberger |
| 5,909,572 A | 6/1999 | Thayer et al. |
| 6,061,521 A | 5/2000 | Thayer et al. |
| 6,112,019 A | 8/2000 | Chamdani et al. |
| 6,212,601 B1 | 4/2001 | Shiell |
| 6,275,508 B1* | 8/2001 | Aggarwal ............... H04L 29/06 370/394 |
| 6,597,664 B1 | 7/2003 | Mithal et al. |
| 7,028,281 B1 | 4/2006 | Agrawal et al. |
| 7,111,273 B1 | 9/2006 | Ganesan et al. |
| 7,203,718 B1 | 4/2007 | Fu et al. |
| 7,305,582 B1 | 12/2007 | Moser et al. |
| 7,315,991 B1 | 1/2008 | Bennett |
| 7,375,550 B1 | 5/2008 | Redgrave et al. |
| 7,386,820 B1 | 6/2008 | Koelbl et al. |
| 7,415,681 B2 | 8/2008 | Tomar et al. |
| 7,471,104 B1 | 12/2008 | Chirania |
| 7,516,446 B2 | 4/2009 | Choi et al. |
| 7,647,567 B1 | 1/2010 | Esposito et al. |
| 7,735,047 B1 | 6/2010 | Anderson et al. |
| 7,735,050 B2 | 6/2010 | Yu et al. |
| 7,823,117 B1 | 10/2010 | Bennett |
| 7,844,924 B2 | 11/2010 | Sasao et al. |
| 8,095,508 B2 | 1/2012 | Chamberlain et al. |
| 8,209,580 B1 | 6/2012 | Varnica et al. |
| 8,468,510 B1 | 6/2013 | Sundararajan et al. |
| 8,599,049 B2 | 12/2013 | Wang et al. |
| 8,620,881 B2 | 12/2013 | Chamberlain et al. |
| 8,656,347 B2 | 2/2014 | Ito |
| 8,671,371 B1 | 3/2014 | Dimond |
| 8,775,986 B1 | 7/2014 | Mohan et al. |
| 8,881,079 B1 | 11/2014 | Pan et al. |
| 8,930,926 B2 | 1/2015 | Bastoul et al. |
| 9,471,307 B2 | 10/2016 | Giroux et al. |
| 9,690,278 B1 | 6/2017 | Chen et al. |
| 9,824,756 B2 | 11/2017 | Brand et al. |
| 9,846,623 B2 | 12/2017 | Jennings et al. |
| 9,858,373 B2 | 1/2018 | Cho et al. |
| 10,162,918 B1 | 12/2018 | Iyer et al. |
| 10,331,836 B1 | 6/2019 | Hosangadi et al. |
| 10,419,338 B2 | 9/2019 | Gray |
| 10,474,533 B2 | 11/2019 | Jennings et al. |
| 2002/0080174 A1* | 6/2002 | Kodosky ............... G06F 30/34 715/762 |
| 2003/0154466 A1 | 8/2003 | Snider |
| 2005/0050531 A1 | 3/2005 | Lee |
| 2006/0075180 A1 | 4/2006 | Tian et al. |
| 2006/0120189 A1 | 6/2006 | Beerel et al. |
| 2006/0268939 A1 | 11/2006 | Dries et al. |
| 2007/0094474 A1 | 4/2007 | Wilson et al. |
| 2007/0143717 A1 | 6/2007 | Koelbl et al. |
| 2007/0171101 A1 | 7/2007 | Siemers et al. |
| 2007/0174804 A1 | 7/2007 | Sasao et al. |
| 2007/0180334 A1 | 8/2007 | Jones et al. |
| 2007/0300192 A1 | 12/2007 | Curtin et al. |
| 2008/0005357 A1 | 1/2008 | Malkhi et al. |
| 2008/0075278 A1 | 3/2008 | Gaubatz et al. |
| 2008/0111721 A1 | 5/2008 | Reznik |
| 2008/0111722 A1 | 5/2008 | Reznik |
| 2008/0229141 A1 | 9/2008 | Chang et al. |
| 2008/0313579 A1 | 12/2008 | Larouche et al. |
| 2009/0210412 A1 | 8/2009 | Oliver et al. |
| 2009/0243732 A1 | 10/2009 | Tarng et al. |
| 2010/0162049 A1 | 6/2010 | Stall et al. |
| 2011/0078640 A1 | 3/2011 | Bruneel |
| 2012/0065956 A1 | 3/2012 | Irturk et al. |
| 2013/0013301 A1 | 1/2013 | Subbaraman et al. |
| 2013/0054939 A1 | 2/2013 | Felch |
| 2013/0081060 A1 | 3/2013 | Otenko |
| 2013/0100750 A1 | 4/2013 | Ishiguro et al. |
| 2013/0111425 A1 | 5/2013 | Kumar et al. |
| 2013/0111453 A1 | 5/2013 | Kalogeropulos et al. |
| 2013/0125097 A1 | 5/2013 | Ebcioglu et al. |
| 2013/0139122 A1 | 5/2013 | Pell et al. |
| 2013/0212365 A1 | 8/2013 | Chen et al. |
| 2013/0226594 A1 | 8/2013 | Fuchs et al. |
| 2013/0298130 A1 | 11/2013 | Pienaar et al. |
| 2013/0335853 A1 | 12/2013 | Li et al. |
| 2014/0059524 A1 | 2/2014 | Kee et al. |
| 2014/0237437 A1 | 8/2014 | Mang et al. |
| 2015/0052298 A1 | 2/2015 | Brand et al. |
| 2015/0178418 A1 | 6/2015 | Gu et al. |
| 2015/0178435 A1 | 6/2015 | Kumar |
| 2015/0295552 A1 | 10/2015 | Abou-chahine et al. |
| 2015/0304068 A1 | 10/2015 | Xiong et al. |
| 2016/0087651 A1 | 3/2016 | Lu |
| 2016/0180001 A1 | 6/2016 | Adler |
| 2016/0246571 A1 | 8/2016 | Walters, III |
| 2016/0259023 A1 | 9/2016 | Overall et al. |
| 2016/0299998 A1 | 10/2016 | Isshiki |
| 2016/0344629 A1 | 11/2016 | Gray |
| 2017/0140513 A1 | 5/2017 | Su et al. |
| 2017/0185508 A1 | 6/2017 | Looney et al. |
| 2017/0192921 A1 | 7/2017 | Wang et al. |
| 2017/0251211 A1 | 8/2017 | Froehlich et al. |
| 2017/0277656 A1 | 9/2017 | John et al. |
| 2017/0315815 A1 | 11/2017 | Smith |
| 2017/0316154 A1 | 11/2017 | Fitch et al. |
| 2018/0129475 A1 | 5/2018 | Almagambetov et al. |
| 2018/0143872 A1 | 5/2018 | Sun et al. |
| 2018/0232475 A1 | 8/2018 | Derisavi et al. |
| 2018/0253368 A1 | 9/2018 | Villarreal et al. |
| 2018/0255206 A1 | 9/2018 | Kim et al. |
| 2018/0330022 A1 | 11/2018 | Choi et al. |
| 2018/0342040 A1* | 11/2018 | Nguyen ............... G06T 15/005 |
| 2018/0347498 A1 | 12/2018 | Maloney |
| 2019/0114548 A1 | 4/2019 | Wu et al. |
| 2019/0138365 A1 | 5/2019 | Purnell et al. |
| 2019/0286973 A1 | 9/2019 | Kovvuri et al. |
| 2019/0303153 A1 | 10/2019 | Halpern et al. |
| 2020/0167139 A1* | 5/2020 | Drepper ............... G06F 8/436 |
| 2020/0225919 A1 | 7/2020 | Pelton et al. |
| 2020/0225921 A1 | 7/2020 | Pelton et al. |
| 2020/0226051 A1 | 7/2020 | Pelton et al. |
| 2020/0226227 A1 | 7/2020 | Pelton et al. |
| 2020/0226228 A1 | 7/2020 | Pelton et al. |
| 2021/0049163 A1 | 2/2021 | Levy et al. |

OTHER PUBLICATIONS

"Re-order Buffer", Retrieved From: https://en.wikipedia.org/w/index.php?title=Re-order_buffer&oldid=928835149 Retrieved on: Dec. 1, 2019, 1 Page.

"Non-Final Office Action Issued in U.S. Appl. No. 16/247,250", dated Dec. 27, 2019, 14 Pages.

"Ex Parte Quayle Action Issued in U.S. Appl. No. 16/247,261", dated Feb. 4, 2020, 7 Pages.

"Non Final Office Action Issued in U.S. Appl. No. 16/247,269", dated Feb. 20, 2020, 14 Pages.

Cong, et al., "Combinational Logic Synthesis for LUT Based Filed Programmable Gate Arrays", In Proceedings of the ACM Transactions on Design Automation of Electronic Systems, Apr. 1996, pp. 145-204.

Tan, et al., "Mapping-Aware Constrained Scheduling for LUT-Based FPGAs", In Proceedings of the ACM/SIGDA International Symposium on Field-Programmable Gate Arrays, Feb. 22, 2015, 10 Pages.

"International Search Report and Written Opinion Issued in PCT Application No. PCT/US2019/069030", dated Mar. 27, 2020, 11 Pages.

"Operand Forwarding", Retrieved From: https://en.wikipedia.org/w/index.php?title=Operand_forwarding&oldid=868126536, Retrieved on: Nov. 10, 2018, 2 Pages.

"Register File", Retrieved From: https://en.wikipedia.org/wiki/Register_file, Retrieved on: Dec. 13, 2019, 8 Pages.

Ditmar, et al., "Function Call Optimisation in SystemC Hardware Compilation", In Proceedings of 4th Southern Conference on Programmable Logic, Mar. 26, 2008, pp. 93-98.

"International Search Report and Written Opinion Issued in PCT Application No. PCT/US2019/069028", dated Apr. 24, 2020, 13 Pages.

(56) References Cited

OTHER PUBLICATIONS

"International Search Report and Written Opinion Issued in PCT Application No. PCT/US2019/069031", dated May 4, 2020, 13 Pages.
"International Search Report and Written Opinion Issued in PCT Application No. PCT/US2019/069032", dated Apr. 24, 2020, 13 Pages.
"International Search Report and Written Opinion Issued in PCT Application No. PCT/US2020/012278", dated Apr. 6, 2020, 15 Pages.
Arar, Steve, "Concurrent Conditional and Selected Signal Assignment in VHDL", https://www.allaboutcircuits.com/technical-articles/concurrent-conditional-and-selected-signal-assignment-in-vhdl/, Jan. 3, 2018, 8 Pages.
Galloway, et al., "The Transmogrifier C hardware description language and compiler for FPGAs", In Proceedings IEEE Symposium on FPGAs for Custom Computing Machines, Apr. 19, 1995, pp. 136-144.
"International Search Report and Written Opinion Issued in PCT Application No. PCT/US2019/069034", dated Jun. 23, 2020, 19 Pages.
"Non-Final Office Action Issued in U.S. Appl. No. 16/247,181", dated Jul. 9, 2020, 11 Pages.
"Final Office Action Issued in U.S. Appl. No. 16/247,250", dated Apr. 13, 2020, 22 Pages.
"Final Office Action Issued in U.S. Appl. No. 16/247,269", dated Oct. 16, 2020, 15 Pages.
"Non-Final Office Action Issued in U.S. Appl. No. 16/247,203", dated Nov. 9, 2020, 8 Pages.
"Non Final Office Action Issued in U.S. Appl. No. 16/247,250", dated Nov. 12, 2020, 18 Pages.
"Final Office Action Issued in U.S. Appl. No. 16/247,181", dated Jan. 28, 2021, 16 Pages.
"Non Final Office Action Issued in U.S. Appl. No. 16/247,181", dated Jun. 9, 2021, 13 Pages.
"Notice of Allowance Issued in U.S. Appl. No. 16/247,203", dated Jun. 3, 2021, 8 Pages.
"Notice of Allowance Issued in U.S. Appl. No. 16/247,250", dated Apr. 14, 2021, 25 Pages.
Hatami, et al., "High Performance Architecture for Flow-Table Lookup in SDN on FPGA", In Repository of arXiv:1801.00840, Jan. 2, 2018, 15 Pages.
"Final Office Action Issued in U.S. Appl. No. 16/247,203", dated Apr. 1, 2021, 6 Pages.

\* cited by examiner

GENERATING SYNCHRONOUS DIGITAL CIRCUITS FROM SOURCE CODE CONSTRUCTS THAT MAP TO CIRCUIT IMPLEMENTATIONS

BACKGROUND

Hardware description languages ("HDLs") are modeling languages used by hardware engineers to describe the structure and behavior of electronic circuits, most commonly digital logic circuits. Examples of HDLs include Very High Speed Integrated Circuit ("VHSIC") HDL and VERILOG.

HDLs commonly require many lines of code to model digital logic circuits. Even for hardware engineers that are very familiar with HDLs, creation of such code can be extremely time consuming. Moreover, the more lines of code present in a design, the more likely it is for the design to include errors or perform poorly.

Additionally, because HDLs typically utilize a different programming paradigm than imperative programming languages, software engineers that are not intimately familiar with HDLs commonly have a very difficult time utilizing these languages. As a result, electronic circuits generated from HDL created by software engineers can also include errors or perform poorly.

It is with respect to these and other technical challenges that the disclosure made herein is presented.

SUMMARY

Technologies are disclosed for generating synchronous digital circuits ("SDCs") from source code constructs that efficiently map to circuit implementations. Through implementations of the disclosed technologies, hardware engineers can realize significant productivity gains by reducing the number of lines of HDL code required to implement some types of SDCs, and by eliminating whole classes of common design errors, while at the same time not sacrificing performance. For software engineers who have little or no experience with using HDLs to design SDCs, the disclosed technologies offer a familiar programming paradigm that can be used to quickly and easily generate high performance SDC designs. Other technical benefits not specifically mentioned herein can also be realized through implementations of the disclosed subject matter.

In order to realize the technical benefits mentioned briefly above, program source code is generated in a multi-threaded imperative programming language and stored. The disclosed language is imperative, in that program statements are executed one after another, and multi-threaded in that multiple threads of execution can be executing in parallel. A thread refers to a collection of local variables. Threads are executed as the local variables are processed by a hardware circuit.

The threads described herein are analogous to, yet different from, software threads. While a software thread maintains a call stack containing local variables and executes code in memory, the threads described herein are collections of local variables that move through hardware circuits. While a software thread has a location in executable code determined by an instruction pointer, the disclosed threads has a physical location on an SDC at a given point in time. Additionally, the language constructs described herein map to circuit implementations that guarantee thread ordering (i.e. that threads will exit a circuit implementation in the same order that they entered).

The multi-threaded imperative programming language disclosed herein includes language constructs (or "constructs") that map to circuit implementations. A language construct is a syntactically allowable part of a program that may be formed from one or more lexical tokens. The circuit implementations can be implemented as an SDC in a field-programmable gate array ("FPGA"), a gate array, an application-specific integrated circuit ("ASIC"), or another type of suitable device. Another hardware component, such as a network interface card ("NIC"), can be configured with the FPGA, gate array, or ASIC, in order to implement desired functionality.

In one configuration, the construct includes a condition statement that enables a thread in a pipeline to wait for a specified condition to occur. The condition might be expressed as "wait for (x>global_variable)", for example. In this configuration, the construct maps to a circuit implementation that includes a hardware pipeline (or "pipeline") that implements functionality defined by source code instructions prior to the condition statement. The circuit implementation also includes a second hardware pipeline that implements functionality specified by source code instructions after the condition statement. The first hardware pipeline outputs to a queue. The second pipeline obtains its input from the queue.

In this configuration, the second hardware pipeline processes a value from the queue only when the condition defined by the condition statement is evaluated as true (e.g. when x>global_variable in the example above). In some configurations, the condition is evaluated in the second pipeline by comparing the value obtained from the queue to a value stored in a register or another type of on-chip memory, such as a static random-access memory ("SRAM"). The value stored in the register can be generated by a third pipeline, for example. Values in the queue (e.g. x in the example given above) correspond to local variables.

In another configuration, a construct identifies the start and end of a portion of source code instructions that are to be executed atomically. As used herein, the terms "atomically" and "atomic" refer to a circuit implementation that permits only one thread to be executing at a time. In this configuration, the circuit implementation includes a single hardware pipeline stage for implementing the instructions to be executed atomically. The single hardware pipeline stage executes in a single clock cycle. The single hardware pipeline stage can receive input from one or more input registers and output values to one or more output registers. This construct implements thread synchronization by mapping to a circuit implementation that allows only one thread to be inside of the atomic region at a time.

In another configuration, a construct indicates that read-modify-write memory operations are to be performed atomically. This construct implements thread synchronization by mapping to a circuit implementation that performs synchronized read-modify-write operations with on-chip memories. This ensures that problems with read-write-modify operations are avoided without performance degradation.

In this configuration, the circuit implementation includes a memory and at least one first hardware pipeline stages. The first hardware pipeline stage can load a value from on-chip memory. The first hardware pipeline stage provides the value read from the memory to a second pipeline stage.

The second hardware pipeline stage compares the memory address of the loaded value to one or more addresses associated with recent (e.g. immediately previous) memory store operations. If the addresses match, then the value loaded from the memory most recently is discarded, and a value stored in the register during the recent store operation is modified in the manner described below. If the addresses do not match, then the then the value loaded from the memory by the most recently load operation is modified in the manner described below.

The second hardware pipeline stage then performs the user-specified computation on the most recently loaded value or the value from the previous store operation to generate a modified value. The operation specified by the read-modify-write construct can be arbitrarily complex. For example, and without limitation, if the construct specifies an operation in the form of "memory [x]=(memory [x]+y)*2", the "+y" and "*2" instructions occur atomically in the same pipeline stage that modifies values if the load address matches the load address for a recent store.

The second pipeline stage stores the modified value in the register for use during the next read-modify-write operation. The second pipeline stage also stores the address in the register, also for use during the next read-modify write operation.

One or more third hardware pipeline stages follow the second hardware pipeline stage. The one or more third hardware pipeline stages are configured to receive the modified value from the second pipeline stage and to store the value at the memory address in the on-chip memory.

Once program source code has been defined having a construct that maps to a circuit implementation, the source code, including the construct, can be compiled to generate a circuit description. The circuit description can be expressed using HDL, for instance. The circuit description can, in turn, be used to generate an SDC that includes the circuit implementation. For example, HDL might be utilized to generate an FPGA image or bitstream that includes the circuit implementation defined by the construct. The FPGA image or bitstream can, in turn, be utilized to program an FPGA that includes the circuit implementation.

As discussed briefly above, implementations of the technologies disclosed herein enable hardware and software engineers alike to easily and quickly generate certain performant and reliable SDC implementations using programming constructs that map to the SDC implementations. Other technical benefits not specifically identified herein can also be realized through implementations of the disclosed technologies.

It should be appreciated that the above-described subject matter can be implemented as a computer-controlled apparatus, a computer-implemented method, a computing device, or as an article of manufacture such as a computer readable medium. These and various other features will be apparent from a reading of the following Detailed Description and a review of the associated drawings.

This Summary is provided to introduce a brief description of some aspects of the disclosed technologies in a simplified form that are further described below in the Detailed Description. This Summary is not intended to identify key features or essential features of the claimed subject matter, nor is it intended that this Summary be used to limit the scope of the claimed subject matter. Furthermore, the claimed subject matter is not limited to implementations that solve any or all disadvantages noted in any part of this disclosure.

DETAILED DESCRIPTION

Figure 1:
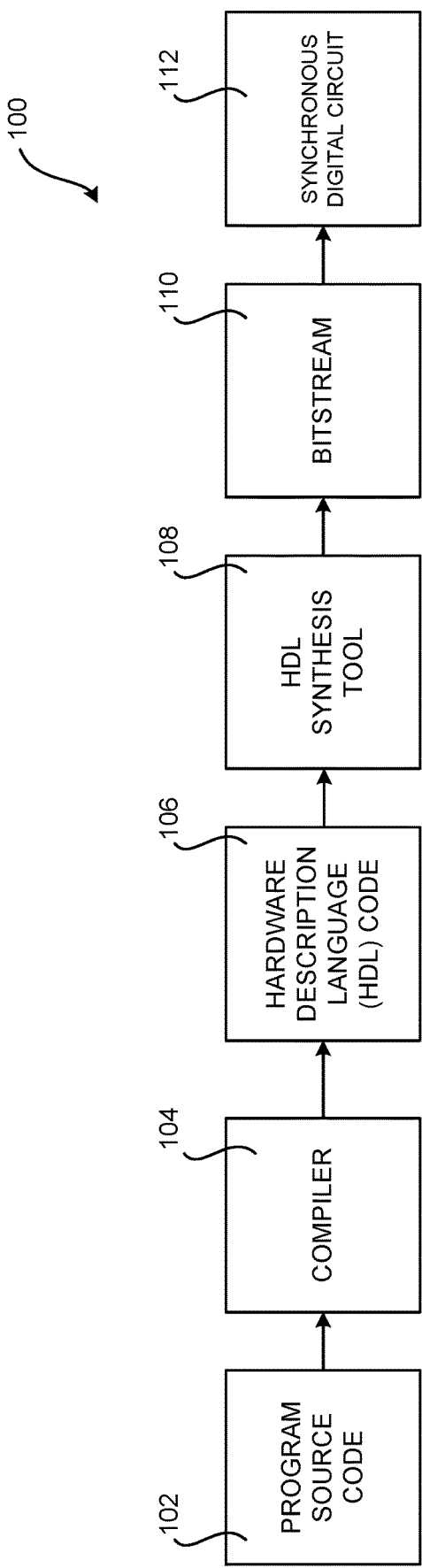
FIG. 1 is a computing architecture diagram that shows aspects of a system disclosed herein for generating a synchronous digital circuit based on program source code that includes a programming construct that maps to the synchronous digital circuit.

The following detailed description is directed to technologies for generating SDCs from source code constructs that efficiently map to circuit implementations. As discussed briefly above, implementations of the technologies disclosed herein enable the creation of performant and reliable SDC implementations using programming constructs in an iterative multi-threaded programming language that efficiently map to the SDC implementations. Other technical benefits not specifically mentioned herein can also be realized through implementations of the disclosed subject matter.

While the subject matter described herein is presented in the general context of a computing system executing a compiler configured for compiling source code language constructs that map to circuit implementations, those skilled in the art will recognize that other implementations can be performed in combination with other types of computing systems and modules. Those skilled in the art will also appreciate that the subject matter described herein can be practiced with other computer system configurations, including hand-held devices, multiprocessor systems, microprocessor-based or programmable consumer electronics, computing or processing systems embedded in devices (such as wearable computing devices, automobiles, home automation etc.), minicomputers, mainframe computers, and the like.

In the following detailed description, references are made to the accompanying drawings that form a part hereof, and which are shown by way of illustration specific configurations or examples. Referring now to the drawings, in which like numerals represent like elements throughout the several FIGS., aspects of various technologies for generating SDCs from source code constructs that efficiently map to circuit implementations will be described.

FIG. 1 is a computing architecture diagram that shows aspects of an illustrative system 100 disclosed herein for defining and generating a synchronous digital circuit ("SDC") 112 based on program source code 102 that includes a programming construct that maps to the SDC 112. SDCs 112 can be implemented by Gate Arrays, Field Programmable Gate Arrays ("FPGAs"), Application Specific Integrated Circuits ("ASICs"), and other types of circuit devices. While the disclosed subject matter is primarily described in the context of an SDC 112 implemented in an FPGA, it is to be appreciated that the technologies disclosed herein can be utilized to define SDCs 112 that are implemented using other types of devices.

As illustrated in FIG. 1, the illustrative system 100 includes a compiler 104 that compiles program source code 102 to generate hardware description language ("HDL") code 106 or a lower-level representation of a circuit, such as a netlist. As discussed briefly above, HDLs are modeling languages used by hardware engineers to describe the structure and behavior of electronic circuits, most commonly digital logic circuits. Examples of HDLs include VHSIC HDL and VERILOG.

As will be described in detail below, the program source code 102 is expressed using a multi-threaded imperative programming language designed to target SDCs 112. The disclosed language provides many of the features of languages such as 'C' and 'JAVA, such as function calls, for-loops, arithmetic operators, and conditional statements. However, the disclosed language includes constructs that map directly to an underlying SDC 112 hardware implementation. This enables both hardware and software engineers to reason about performance, and to be effective in optimizing their designs. As mentioned above, this can also make the language familiar to software engineers, and free hardware engineers from dealing with whole classes of bugs that arise when coding in an HDL.

The disclosed multi-threaded imperative programming language is imperative, in that program statements are executed one after another, and multi-threaded in that multiple threads of execution can be executing in parallel. As discussed above, a thread is a collection of local variables. Threads are executed as the local variables are processed by a hardware circuit.

The threads described herein are analogous to, yet different, from software threads. While a software thread maintains a call stack containing local variables and executes code in memory, the threads described herein are collections of local variables that move through hardware circuits. While a software thread has a location in executable code determined by an instruction pointer, the disclosed thread has a physical location on the SDC at a given point in time. SDCs may execute hundreds, thousands, or even millions of threads, and SDC execution may be pipelined—i.e. different threads may execute within different stages of a circuit at the same time.

As will be described in greater detail below, language constructs can be defined in the program source code 102 that map to a circuit implementation. A language construct is a syntactically allowable part of a program that may be formed from one or more lexical tokens. The language constructs described herein map to circuit implementations that guarantee thread ordering (i.e. that threads will exit a circuit implementation in the same order that they entered).

As will also be described in greater detail below, the circuit implementations generated by the constructs disclosed herein can be implemented as an SDC in an FPGA, a gate array, an ASIC, or another type of suitable device. Another hardware component, such as a NIC, can be configured with the FPGA, gate array, or ASIC, in order to implement desired functionality.

As shown in FIG. 1, a compiler 104 can compile the program source code 102 including one or more of the language constructs disclosed herein to a circuit description, HDL code 106 in this example. The HDL code 106 can be provided to an HDL synthesis tool 108 which, in turn, can generate a bitstream 110 that can be utilized to program an SDC 112, such as for instance on an FPGA. When targeting an ASIC, the HDL code 106 can be provided to an ASIC fabricator for production in a factory.

Figure 2:
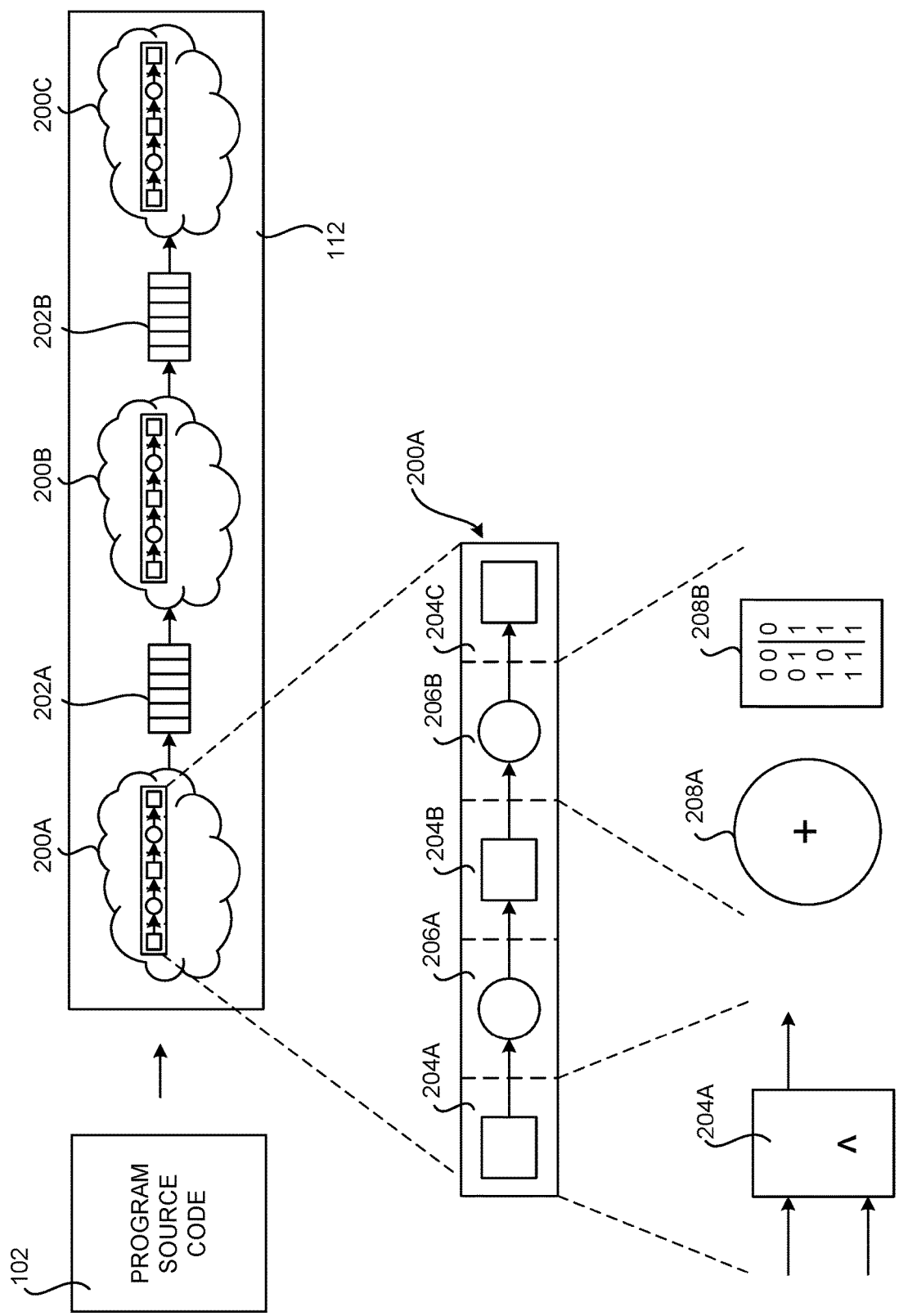
FIG. 2 is a hardware architecture diagram showing aspects of an illustrative example synchronous digital circuit, that includes several hardware pipelines, each having multiple pipeline stages, and computational units that can be defined and implemented using the disclosed technologies.

FIG. 2 is a hardware architecture diagram showing aspects of an illustrative example SDC 112 that includes several hardware pipelines 200A-200C (or "pipelines") that can be defined and implemented using the disclosed technologies. Each hardware pipeline has multiple pipeline stages 206, each of which has computational units 208. As shown in FIG. 2, the program source code 102 can be compiled into pipelines 200A-200C of hardware computational units 208.

The pipelines 200A-200C can be connected by first-in-first-out ("FIFO") queues (which might be referred to herein as "FIFOs" or "queues"). The pipelines 200A-200C implement the functionality defined by the program source code 102. The FIFOs 202 store data values, providing input to pipelines 200 as well as storing output generated by pipelines 200. For example, the SDC 112 includes a pipeline 200A that feeds its output to the FIFO 202A. Pipeline 200B, in turn, obtains its input from the FIFO 202A and provides its output to the FIFO 202B. The pipeline 200C obtains its input from the FIFO 202B.

In some configurations, the pipelines 200 implement a circuitry that determines when to retrieve the next value(s) from a FIFO 202. For example, a policy may require that an input FIFO (e.g. the FIFO 202A in the case of the pipeline 200B) is not empty and an output FIFO (e.g. the FIFO 202B) is not full before retrieving a value from the input FIFO (e.g. the FIFO 202A) for processing.

As shown in FIG. 2, a pipeline 200 may consist of one or more pipeline stages 206A-206B. Execution is pipelined by executing different threads in different stages 206 of a pipeline 200 concurrently. The results of stages can be stored in registers 204 and provided to the next stage 206 for the duration of the next clock cycle.

Each pipeline stage 206 can include one or more computational units 208, such as adder 208A and lookup table ("LUT") 208B. In the illustrated example, adder 208A can perform basic arithmetic, e.g. addition, subtraction, or multiplication. Computational units can also implement Boolean operators (e.g. "OR", "NOR", "XOR", etc.) or other custom logic provided by the SDC manufacturer.

Computational units can also be implemented by user-programmable lookup tables 208B. The illustrated LUT 208B depicts a two-input truth table that maps two input bits to a single output bit. LUTs 208B can be configured to support different numbers of input bits. To generate more complex output values, e.g. characters or 8-bit integers, multiple LUTs 208B, each connected to a different bit of an input variable, may be used.

Computational units can temporarily store results in registers 204 (or "flip-flops"). The contents of such a register can be provided to other computation units in the same or different pipeline 200. Registers 204 can capture a value at an input when a connected digital clock transitions from 0 to 1, and provide that value at an output until the end of the next clock cycle (i.e. until the clock transitions from 0 to 1 again). Registers can also include an enable line. If an enable line is set to false, then the register will not perform the operations described above, maintaining the current output value over multiple clock cycles.

It is to be appreciated that the pipeline architecture shown in FIG. 2 has been simplified for discussion purposes. The programming language constructs described herein can be utilized to implement much more complex SDCs 112 that include many more components than illustrated in FIG. 2.

Figure 3:
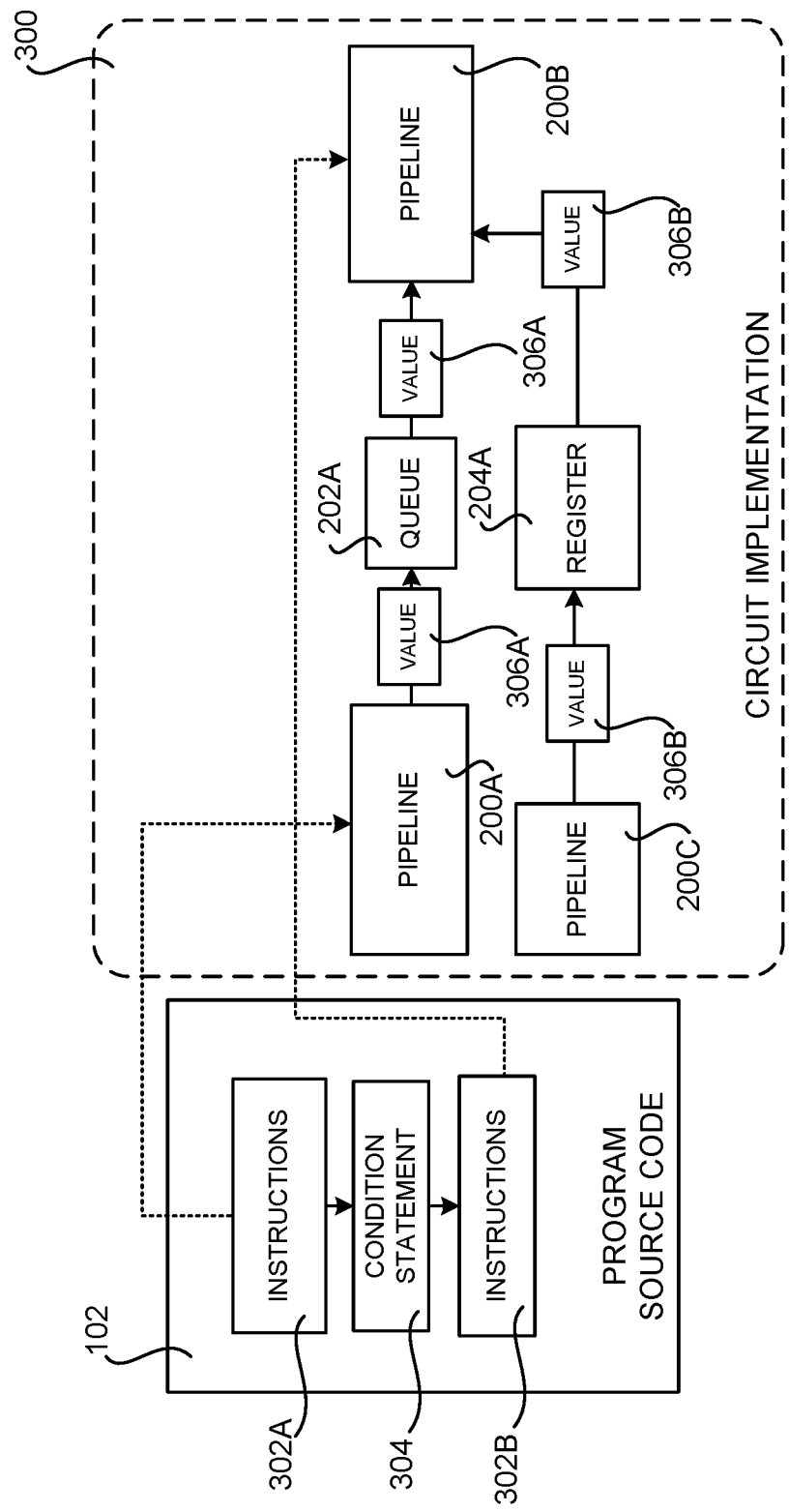
FIG. 3 is a hardware architecture diagram that shows aspects of a language construct that maps to a circuit implementation for enabling a thread in a pipeline to wait for a specified condition to occur.

FIG. 3 is a hardware architecture diagram that shows aspects of a language construct that maps to a circuit implementation 300 for enabling a thread in a pipeline 200 to wait for a specified condition to occur. In this configuration, the language construct defines a condition statement 304 that requires a thread in a pipeline to wait for a specified condition to occur. The condition statement 304 in the program source code 102 might be expressed as "wait for (x>global_variable)", for example, where "x>global_variable" is the condition upon which the pipeline must wait. Other forms of syntax might be used in other configurations.

In this configuration, the language construct maps to a circuit implementation 300 that includes a hardware pipeline 200A that implements functionality defined by instructions 302A in the source code 102 that are located prior to the condition statement 304. The circuit implementation 300 in this configuration also includes a second hardware pipeline 200B that implements functionality specified by instructions 302B in the source code 102 that are located after the condition statement 304. The first hardware pipeline outputs 200A a value 306A to a queue 202A. The second pipeline 200B obtains an input value 306A from the queue 202A.

In operation, the second hardware pipeline 200B processes a value 306A from the queue 202A only when it evaluates the condition defined by the condition statement 304 in the program source code 102 as true (e.g. when x>global_variable) in the example above). In some configurations, the specified condition is evaluated in the second pipeline 200B by comparing the value 306A obtained from the queue 202A to a value 306B stored in a register 204A. The value 306B stored in the register 204A can be generated by a third pipeline 200C, for example. The value 306B corresponds to a global variable in the program source code 102 (e.g. x in the example given above).

Figure 4:
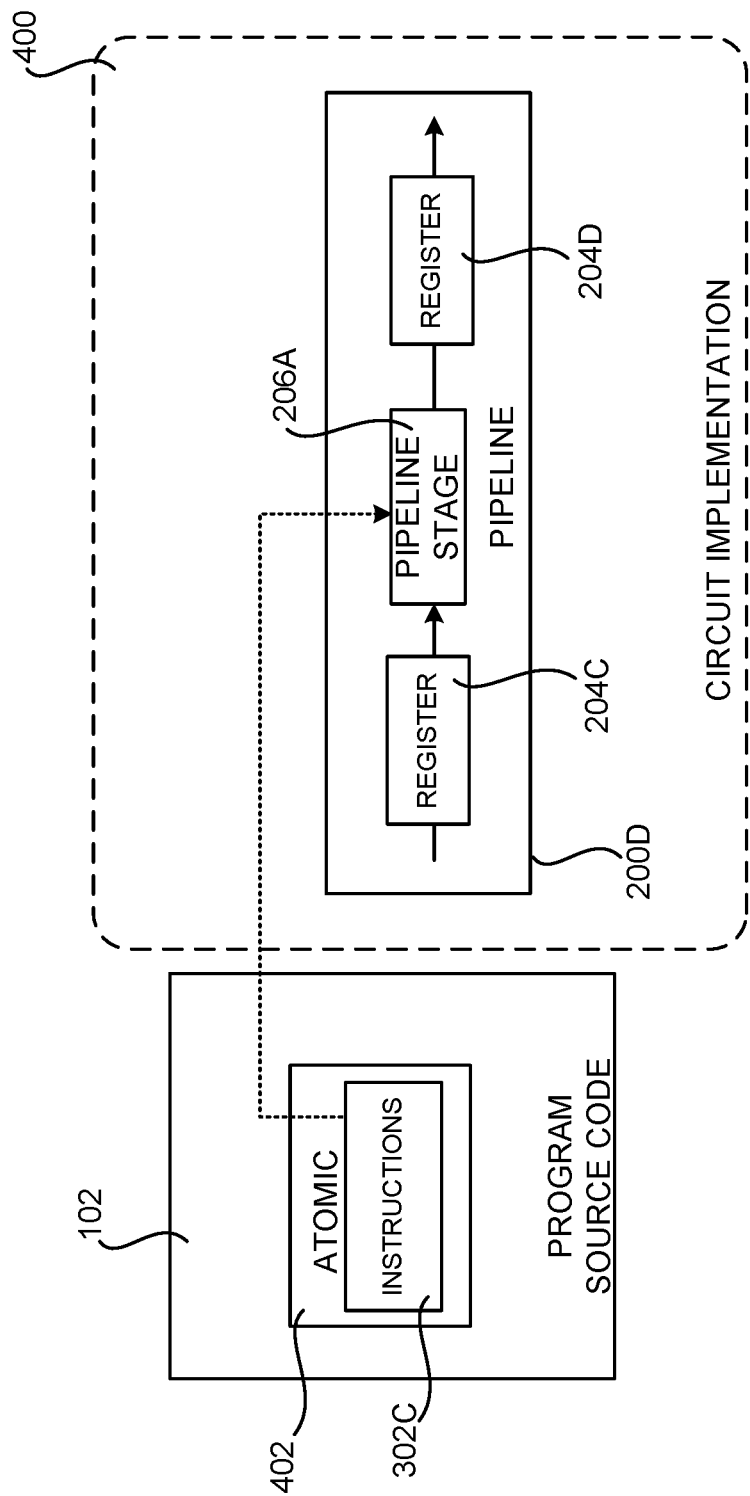
FIG. 4 is a hardware architecture diagram that shows aspects of a language construct that maps to a circuit implementation for implementing source code instructions in hardware atomically.

FIG. 4 is a hardware architecture diagram that shows aspects of a language construct 402 that maps to a circuit implementation 400 for implementing source code instructions in hardware atomically. As discussed above, the terms "atomically" and "atomic" refer to a circuit implementation that permits only one thread to be executing at a time. Atomic operations also complete in a single step (e.g. clock cycle) relative to other operations.

In this configuration, the construct 402 identifies the start and end of a sequence of instructions in the program source code 102 that are to be performed atomically in hardware. For instance, the construct 402 might be expressed as "atomic { }", where the curly braces encompass the instructions 302C that are to execute in hardware atomically. Other forms of syntax might be used in other configurations. As discussed above, this construct implements thread synchronization by mapping to a circuit implementation that allows only one threat to be inside of the atomic region at a time.

The construct 402 maps to a circuit implementation 400 that includes a single hardware pipeline stage 206A for implementing the instructions 302C to be executed atomically. The single hardware pipeline stage 206A executes in a single clock cycle. As shown in FIG. 4, the single hardware pipeline stage 206A can receive input from a register 204C and output values to another register 204D.

Figure 5:
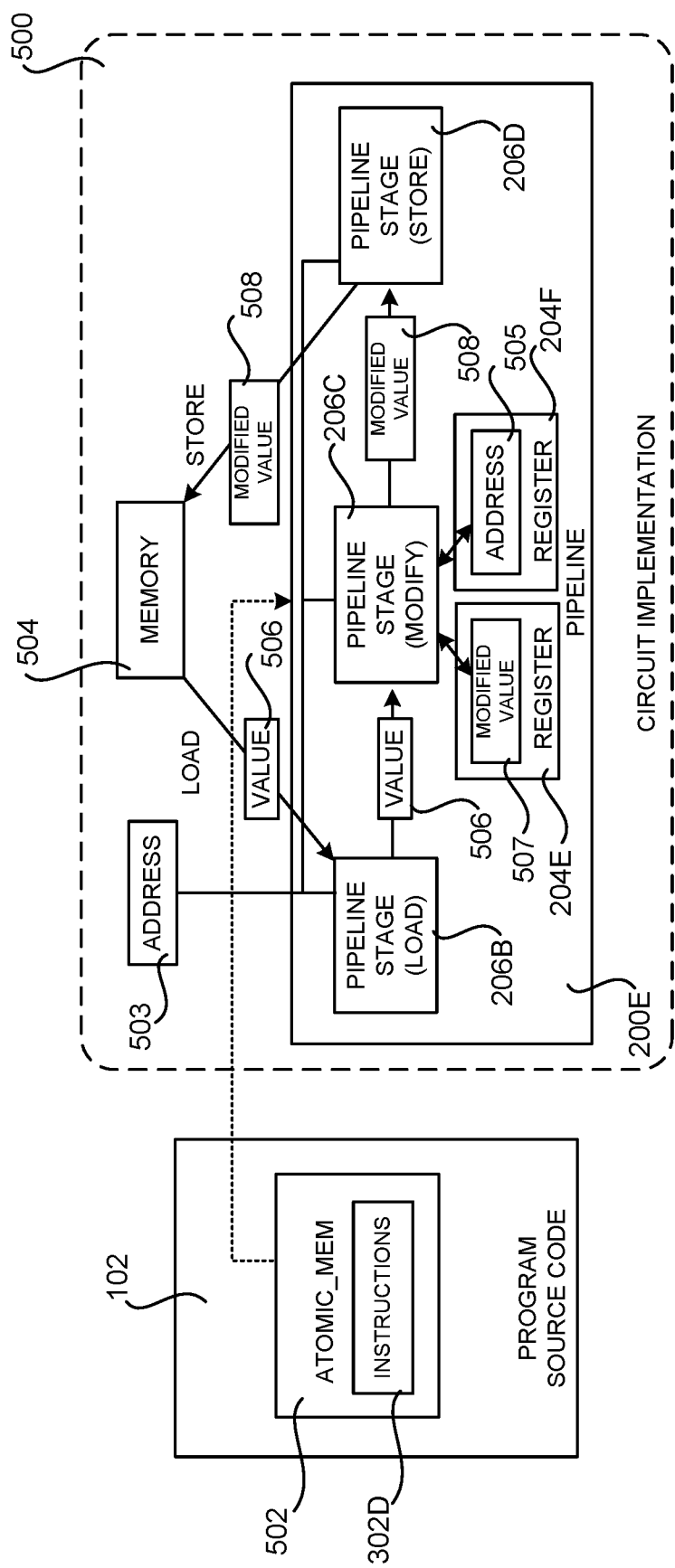
FIG. 5 is a hardware architecture diagram that shows aspects of a language construct that maps to a circuit implementation for a performing a read-modify-write memory operation atomically.

FIG. 5 is a hardware architecture diagram that shows aspects of a language construct 502 that maps to a circuit implementation 500 for a performing a read-modify-write memory operation atomically. The construct 502 can define an arbitrarily complex set of instructions for modifying specified variable during a read-modify-write operation. As discussed above, this construct 502 implements thread synchronization by mapping to a circuit implementation 500 that performs synchronized read-modify-write operations with on-chip memories. This ensures that problems with read-write-modify operations due to non-synchronized thread execution are avoided without performance degradation.

In this configuration, the circuit implementation 500 includes a memory 504 and one or more first hardware pipeline stages 206B. In the illustrated example, a first hardware pipeline stage 206B loads a value 506 from an on-chip memory 504. The value 506 is loaded from an address 503 of the memory 504. The first hardware pipeline stage 206B provides the value 506 read from the memory 504 to a second pipeline stage 206C.

The second hardware pipeline stage 206C compares the address 503 to one or more addresses 505 associated with recent (e.g. immediately previous) store operations. If the addresses match, then the value 506 loaded from the memory 504 is discarded, and a value 507 stored in the register 204E during the recent store operation is modified in the manner described below. If the addresses do not match, then the then the value 506 loaded from the memory 504 is modified in the manner described below.

The second hardware pipeline stage 206C then performs the user-specified computation on the value 506 or the value 507 from the previous store operation to generate a modified value 508. As discussed above, the operation specified by the read-modify-write construct can be arbitrarily complex. For example, and without limitation, if the construct 502 specifies an operation in the form of "memory [x]=(memory [x]+y)*2", the "+y" and "*2" instructions occur atomically in the same pipeline stage 206C that modifies values 506 if the load address 503 matches the load address for a recent store.

The second pipeline stage 206C stores the modified value 508 in the register 204E for use during the next read-modify-write operation. The second pipeline stage 206C also stores the address 503 in the register 204F, also for use during the next read-modify write operation.

One or more third hardware pipeline stages 206D follow the second hardware pipeline stage 206C. The one or more third hardware pipeline stages 206D are configured to receive the modified value 508 from the second pipeline stage 206C and to store the value 508 at the memory address 503 in the on-chip memory 504.

As discussed above, once program source code 102 has been defined and stored having a construct, such as those described above, that maps to a circuit implementation, the source code 102, including the construct, can be compiled to generate a circuit description, such as the HDL code 106 described above. The circuit description can, in turn, be used to generate an SDC 112 that includes the described circuit implementation. For example, HDL code 106 generated by the compiler 104 from the program source code 102 might be utilized to generate an FPGA that includes the circuit implementation defined by the language construct.

Figure 6:
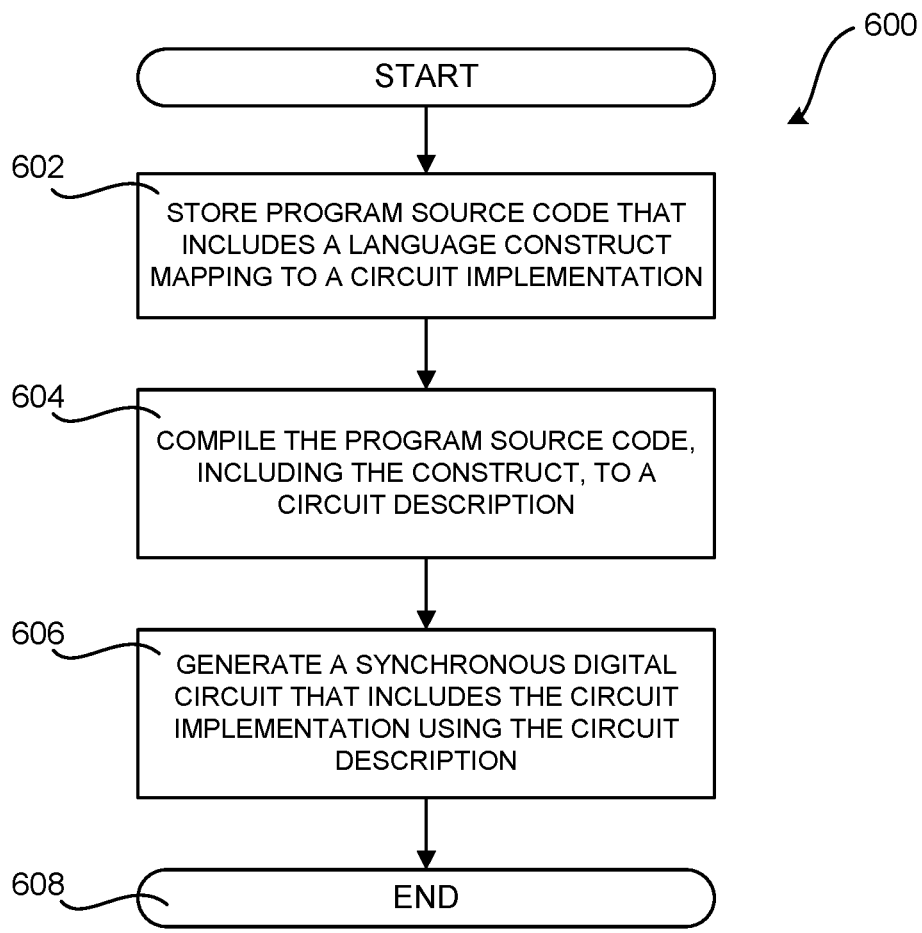
FIG. 6 is a flow diagram showing a routine that illustrates aspects of the operation of the technologies described with reference to FIGS. 1-5 for generating synchronous digital circuits from source code constructs that efficiently map to circuit implementations.

FIG. 6 is a flow diagram showing a routine 600 that illustrates aspects of the operation of the technologies described above with reference to FIGS. 1-5 for generating synchronous digital circuits from source code constructs that map to circuit implementations, according to one embodiment disclosed herein. It should be appreciated that the logical operations described herein with regard to FIG. 6, and the other FIGS., can be implemented (1) as a sequence of computer implemented acts or program modules running on a computing device and/or (2) as interconnected machine logic circuits or circuit modules within a computing device.

The particular implementation of the technologies disclosed herein is a matter of choice dependent on the performance and other requirements of the computing device. Accordingly, the logical operations described herein are referred to variously as states, operations, structural devices, acts, or modules. These states, operations, structural devices, acts and modules can be implemented in hardware, software, firmware, in special-purpose digital logic, and any combination thereof. It should be appreciated that more or fewer operations can be performed than shown in the FIGS. and described herein. These operations can also be performed in a different order than those described herein.

The routine 600 begins at operation 602, where program source code 102 is defined and stored that includes a language construct mapping to a circuit implementation. As described above, for example, a construct might be specified that maps to a circuit implementation 300 for enabling a thread in a pipeline to wait for a specified condition to occur (e.g. FIG. 3), maps to a circuit implementation 400 for implementing source code instructions in hardware atomically (e.g. FIG. 4), or that maps to a circuit implementation 500 for a performing a read-modify-write memory operation atomically (e.g. FIG. 5). Other types of constructs mapping to other types of circuit implementations might be defined in other configurations.

From operation 602, the routine 600 proceeds to operation 604, where the compiler 104 compiles the program source code 102, which includes a language construct mapping to a circuit implementation, to a circuit description. As discussed above, the circuit description might be expressed as HDL code 106.

From operation 604, the routine 600 proceeds to operation 606, where the circuit description (e.g. HDL code) is utilized to generate an SDL that includes the circuit implementation defined by the circuit description. The routine 600 then proceeds from operation 606 to operation 608, where it ends.

Figure 7:
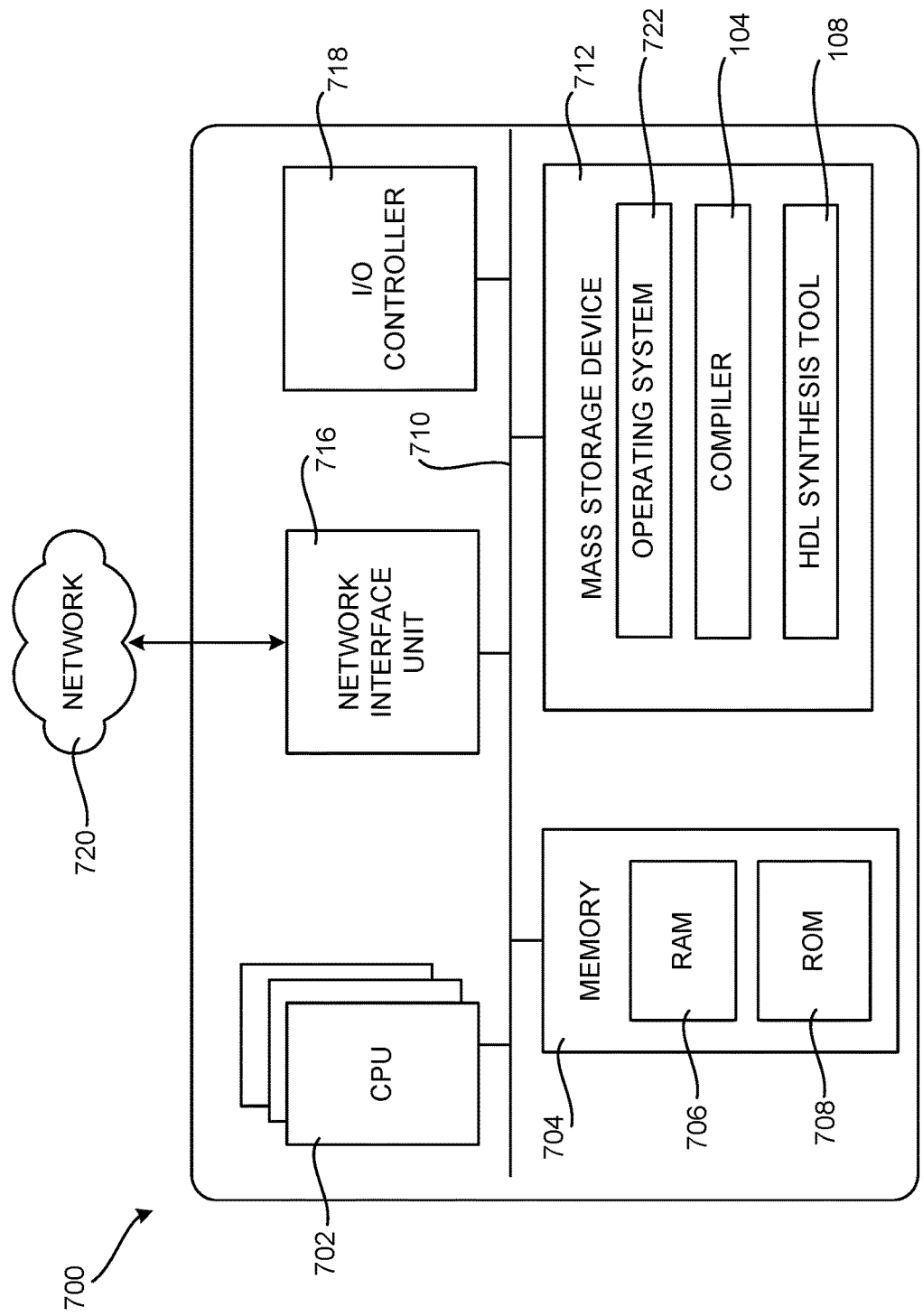
FIG. 7 is a computer architecture diagram showing an illustrative computer hardware and software architecture for a computing device that can implement aspects of the technologies presented herein.

FIG. 7 is a computer architecture diagram showing an illustrative computer hardware and software architecture for a computing device that can implement the various technologies presented herein. In particular, the architecture illustrated in FIG. 7 can be utilized to implement a server computer, mobile phone, an e-reader, a smartphone, a desktop computer, a tablet computer, a laptop computer, or another type of computing device.

The computer 700 illustrated in FIG. 7 includes a central processing unit 702 ("CPU"), a system memory 704, including a random-access memory 706 ("RAM") and a read-only memory ("ROM") 708, and a system bus 710 that couples the memory 704 to the CPU 702. A basic input/output system ("BIOS" or "firmware") containing the basic routines that help to transfer information between elements within the computer 700, such as during startup, can be stored in the ROM 708. The computer 700 further includes a mass storage device 712 for storing an operating system 722, application programs, and other types of programs, such as the compiler 104 and the HDL synthesis tool 108. The mass storage device 712 can also be configured to store other types of programs and data.

The mass storage device 712 is connected to the CPU 702 through a mass storage controller (not shown) connected to the bus 710. The mass storage device 712 and its associated computer readable media provide non-volatile storage for the computer 700. Although the description of computer readable media contained herein refers to a mass storage device, such as a hard disk, CD-ROM drive, DVD-ROM drive, or USB storage key, it should be appreciated by those skilled in the art that computer readable media can be any available computer storage media or communication media that can be accessed by the computer 700.

Communication media includes computer readable instructions, data structures, program modules, or other data in a modulated data signal such as a carrier wave or other transport mechanism and includes any delivery media. The term "modulated data signal" means a signal that has one or more of its characteristics changed or set in a manner so as to encode information in the signal. By way of example, and not limitation, communication media includes wired media such as a wired network or direct-wired connection, and wireless media such as acoustic, radio frequency, infrared and other wireless media. Combinations of the any of the above should also be included within the scope of computer readable media.

By way of example, and not limitation, computer storage media can include volatile and non-volatile, removable and non-removable media implemented in any method or technology for storage of information such as computer readable instructions, data structures, program modules or other data. For example, computer storage media includes, but is not limited to, RAM, ROM, EPROM, EEPROM, flash memory or other solid-state memory technology, CD-ROM, digital versatile disks ("DVD"), HD-DVD, BLU-RAY, or other optical storage, magnetic cassettes, magnetic tape, magnetic disk storage or other magnetic storage devices, or any other medium that can be used to store the desired information and which can be accessed by the computer 700. For purposes of the claims, the phrase "computer storage medium," and variations thereof, does not include waves or signals per se or communication media.

According to various configurations, the computer 700 can operate in a networked environment using logical connections to remote computers through a network such as the network 720. The computer 700 can connect to the network 720 through a network interface unit 716 connected to the bus 710. It should be appreciated that the network interface unit 716 can also be utilized to connect to other types of networks and remote computer systems. The computer 700 can also include an input/output controller 718 for receiving and processing input from a number of other devices, including a keyboard, mouse, touch input, an electronic stylus (not shown in FIG. 7), or a physical sensor such as a video camera. Similarly, the input/output controller 718 can provide output to a display screen or other type of output device (also not shown in FIG. 7).

It should be appreciated that the software components described herein, when loaded into the CPU 702 and executed, can transform the CPU 702 and the overall computer 700 from a general-purpose computing device into a special-purpose computing device customized to facilitate the functionality presented herein. The CPU 702 can be constructed from any number of transistors or other discrete circuit elements, which can individually or collectively assume any number of states. More specifically, the CPU 702 can operate as a finite-state machine, in response to executable instructions contained within the software modules disclosed herein. These computer-executable instructions can transform the CPU 702 by specifying how the CPU 702 transitions between states, thereby transforming the transistors or other discrete hardware elements constituting the CPU 702.

Encoding the software modules presented herein can also transform the physical structure of the computer readable media presented herein. The specific transformation of physical structure depends on various factors, in different implementations of this description. Examples of such factors include, but are not limited to, the technology used to implement the computer readable media, whether the computer readable media is characterized as primary or secondary storage, and the like. For example, if the computer readable media is implemented as semiconductor-based memory, the software disclosed herein can be encoded on the computer readable media by transforming the physical state of the semiconductor memory. For instance, the software can transform the state of transistors, capacitors, or other discrete circuit elements constituting the semiconductor memory. The software can also transform the physical state of such components in order to store data thereupon.

As another example, the computer readable media disclosed herein can be implemented using magnetic or optical technology. In such implementations, the software presented herein can transform the physical state of magnetic or optical media, when the software is encoded therein. These transformations can include altering the magnetic characteristics of particular locations within given magnetic media. These transformations can also include altering the physical features or characteristics of particular locations within given optical media, to change the optical characteristics of those locations. Other transformations of physical media are possible without departing from the scope and spirit of the present description, with the foregoing examples provided only to facilitate this discussion.

In light of the above, it should be appreciated that many types of physical transformations take place in the computer 700 in order to store and execute the software components presented herein. It also should be appreciated that the architecture shown in FIG. 7 for the computer 700, or a similar architecture, can be utilized to implement other types of computing devices, including hand-held computers, video game devices, embedded computer systems, mobile devices such as smartphones, tablets, and other types of computing devices known to those skilled in the art. It is also contemplated that the computer 700 might not include all of the components shown in FIG. 7, can include other components that are not explicitly shown in FIG. 7, or can utilize an architecture completely different than that shown in FIG. 7.

Figure 8:
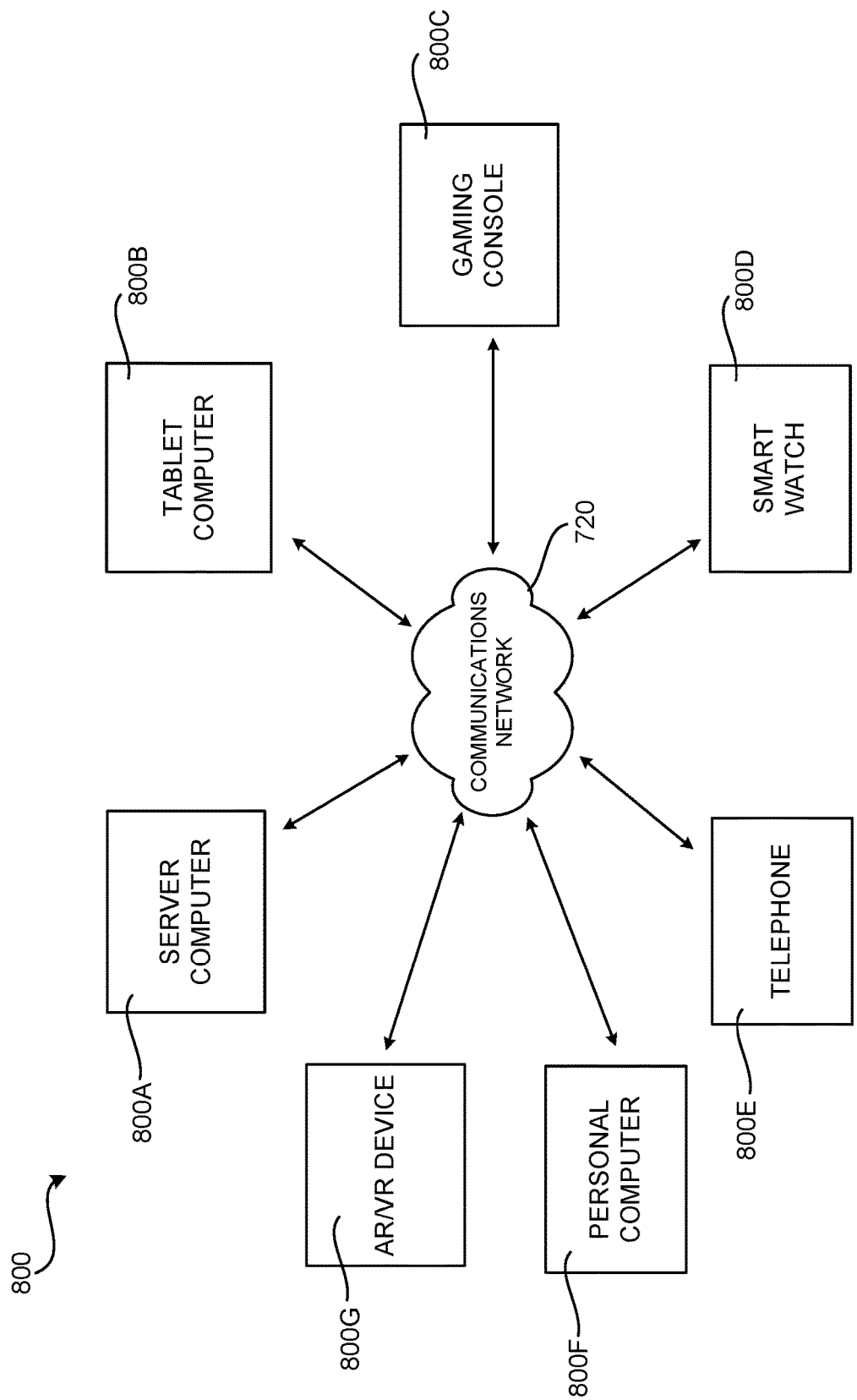
FIG. 8 is a network diagram illustrating a distributed computing environment in which aspects of the disclosed technologies can be implemented.

FIG. 8 is a network diagram illustrating a distributed network computing environment 800 in which aspects of the disclosed technologies can be implemented, according to various embodiments presented herein. As shown in FIG. 8, one or more server computers 800A can be interconnected via a communications network 720 (which may be either of, or a combination of, a fixed-wire or wireless LAN, WAN, intranet, extranet, peer-to-peer network, virtual private network, the Internet, Bluetooth communications network, proprietary low voltage communications network, or other communications network) with a number of client computing devices such as, but not limited to, a tablet computer 800B, a gaming console 800C, a smart watch 800D, a telephone 800E, such as a smartphone, a personal computer 800F, and an AR/VR device 800G.

In a network environment in which the communications network 720 is the Internet, for example, the server computer 800A can be a dedicated server computer operable to process and communicate data to and from the client computing devices 800B-800G via any of a number of known protocols, such as, hypertext transfer protocol ("HTTP"), file transfer protocol ("FTP"), or simple object access protocol ("SOAP"). Additionally, the networked computing environment 800 can utilize various data security protocols such as secured socket layer ("SSL") or pretty good privacy ("PGP"). Each of the client computing devices 800B-800G can be equipped with an operating system operable to support one or more computing applications or terminal sessions such as a web browser (not shown in FIG. 8), or other graphical user interface (not shown in FIG. 8), or a mobile desktop environment (not shown in FIG. 8) to gain access to the server computer 800A.

The server computer 800A can be communicatively coupled to other computing environments (not shown in FIG. 8) and receive data regarding a participating user's interactions/resource network. In an illustrative operation, a user (not shown in FIG. 8) may interact with a computing application running on a client computing device 800B-800G to obtain desired data and/or perform other computing applications.

The data and/or computing applications may be stored on the server 800A, or servers 800A, and communicated to cooperating users through the client computing devices 800B-800G over an exemplary communications network 720. A participating user (not shown in FIG. 8) may request access to specific data and applications housed in whole or in part on the server computer 7800A. These data may be communicated between the client computing devices 800B-800G and the server computer 800A for processing and storage.

The server computer 800A can host computing applications, processes and applets for the generation, authentication, encryption, and communication of data and applications, and may cooperate with other server computing environments (not shown in FIG. 8), third party service providers (not shown in FIG. 8), network attached storage ("NAS") and storage area networks ("SAN") to realize application/data transactions.

It should be appreciated that the illustrative computing architecture shown in FIG. 7 and the illustrative distributed network computing environment shown in FIG. 8 have been simplified for ease of discussion. It should also be appreciated that the computing architecture and the distributed computing network can include and utilize many more computing components, devices, software programs, networking devices, and other components not specifically described herein.

The disclosure presented herein also encompasses the subject matter set forth in the following clauses:

Clause 1. A computer-implemented method, comprising: storing source code expressed in a multi-threaded imperative programming language, the source code comprising a construct that maps to a circuit implementation, the construct comprising a condition statement, and wherein the circuit implementation comprises a first hardware pipeline implementing first instructions prior to the condition statement, the first hardware pipeline having an output connected to a queue, a second hardware pipeline implementing second instructions after the condition statement, the second hardware pipeline having an input connected to the queue, and wherein the second hardware pipeline processes a value from the queue only when the condition statement is evaluated as true; compiling the construct to a circuit description; and generating, based on the circuit description, a synchronous digital circuit comprising the circuit implementation.

Clause 2. The computer-implemented method of clause 1, wherein the condition statement is evaluated by comparing the value from the queue to a value stored in a register.

Clause 3. The computer-implemented method of any of clauses 1-2, wherein the value in the register is generated by a third hardware pipeline.

Clause 4. The computer-implemented method of any of clauses 1-3, wherein the value from the queue comprises a local variable.

Clause 5. The computer-implemented method of any of clauses 1-4, wherein the value stored in the register comprises a global variable.

Clause 6. The computer-implemented method of any of clauses 1-5, wherein the synchronous digital circuit is implemented in a field-programmable gate array (FPGA), a gate array, or an application-specific integrated circuit (ASIC).

Clause 7. The computer-implemented method of any of clauses 1-6, wherein a network interface card (NIC) is configured with the FPGA, gate array, or ASIC.

Clause 8. A computer-implemented method, comprising: storing source code expressed in a multi-threaded imperative programming language, the source code comprising a construct that maps to a circuit implementation, the construct comprising an indication that a plurality of instructions are to be executed atomically, and wherein the circuit implementation comprises a single hardware pipeline stage for implementing the plurality of instructions, the single hardware pipeline stage configured for execution in a single clock cycle; compiling the construct to a circuit description; and generating, based on the circuit description, a synchronous digital circuit comprising the circuit implementation.

Clause 9. The computer-implemented method of clause 8, wherein the circuit implementation further comprises a first register for outputting values to the single hardware pipeline stage.

Clause 10. The computer-implemented method of any of clauses 8-9, wherein the circuit implementation further comprises a second register for receiving values output by the single hardware pipeline stage.

Clause 11. The computer-implemented method of any of clauses 8-10, wherein the construct identifies a start of the plurality of instructions and an end of the plurality of instructions.

Clause 12. The computer-implemented method of any of clauses 8-11, wherein the synchronous digital circuit is implemented in a field-programmable gate array (FPGA), a gate array, or an application-specific integrated circuit (ASIC).

Clause 13. The computer-implemented method of any of clauses 8-12, wherein a network interface card (NIC) is configured with the FPGA, gate array, or ASIC.

Clause 14. The computer-implemented method of any of clauses 8-13, wherein the circuit description comprises hardware description language (HDL) code.

Clause 15. A computer-implemented method, comprising: storing source code expressed in a multi-threaded imperative programming language, the source code comprising a construct that maps to a circuit implementation, the construct comprising an indication that a memory read-modify-write operation is to be performed atomically, and wherein the circuit implementation comprises a memory, one or more first hardware pipeline stages for loading a first value stored at a memory address of the memory, a second hardware pipeline stage following the one or more first hardware pipeline stages for comparing the memory address to a memory address associated with previous store operation, modifying a second value stored in a register by the previous store operation to generate a modified value if the memory address and the memory address associated with the previous store operation are the same, and modifying the first value to generate the modified value if the memory address and the memory address associated with the previous store operation are not the same, and one or more third hardware pipeline stages following the second hardware pipeline stage for storing the modified value at the memory address; compiling the construct to a circuit description; and generating, based on the circuit description, a synchronous digital circuit comprising the circuit implementation.

Clause 16. The computer-implemented method of clause 15, wherein the second hardware pipeline stage is further for storing the modified value in the register and storing the memory address of the first value in a second register.

Clause 17. The computer-implemented method of any of clauses 15-16, wherein the second hardware pipeline stage is further for storing the memory address and the value associated with the previous store operation in the register.

Clause 18. The computer-implemented method of any of clauses 15-17, wherein the synchronous digital circuit is implemented in a field-programmable gate array (FPGA), a gate array, or an application-specific integrated circuit (ASIC).

Clause 19. The computer-implemented method of any of clauses 15-18, wherein a network interface card (NIC) is configured with the FPGA, gate array, or ASIC.

Clause 20. The computer-implemented method of any of clauses 15-19, wherein the circuit description comprises hardware description language (HDL) code.

Based on the foregoing, it should be appreciated that technologies for generating SDCs from source code constructs that efficiently map to circuit implementations have been disclosed herein. Although the subject matter presented herein has been described in language specific to computer structural features, methodological and transformative acts, specific computing machinery, and computer readable media, it is to be understood that the subject matter set forth in the appended claims is not necessarily limited to the specific features, acts, or media described herein. Rather, the specific features, acts and mediums are disclosed as example forms of implementing the claimed subject matter.

The subject matter described above is provided by way of illustration only and should not be construed as limiting. Various modifications and changes can be made to the subject matter described herein without following the example configurations and applications illustrated and described, and without departing from the scope of the present disclosure, which is set forth in the following claims.

What is claimed is:

1. A computer-implemented method for constructing synchronous digital circuits (SDCs), comprising:
   storing source code expressed in a multi-threaded imperative programming language, the source code comprising a construct that maps to a circuit implementation, the construct comprising a condition statement, and wherein the circuit implementation comprises:
   a first hardware pipeline implementing first functionality defined by first instructions located prior to the condition statement in the source code, the first hardware pipeline having an output connected to a queue, and
   a second hardware pipeline implementing second functionality defined by second instructions located after the condition statement in the source code and based on the output of the first hardware pipeline, the second hardware pipeline having an input connected to the queue connected to the output of the first hardware pipeline, and wherein the second hardware pipeline processes a value received from the first hardware pipeline by the queue only when the condition statement is evaluated as true;

compiling the construct to output a circuit description in a hardware description language (HDL); and generating, based on the circuit description, a synchronous digital circuit comprising the circuit implementation.

2. The computer-implemented method of claim 1, wherein the condition statement is evaluated by comparing the value from the queue to a value stored in a register.

3. The computer-implemented method of claim 2, wherein the value stored in the register is generated by a third hardware pipeline.

4. The computer-implemented method of claim 3, wherein the value from the queue comprises a local variable.

5. The computer-implemented method of claim 4, wherein the value stored in the register comprises a global variable.

6. The computer-implemented method of claim 1, wherein the synchronous digital circuit is implemented in a field-programmable gate array (FPGA), a gate array, or an application-specific integrated circuit (ASIC).

7. The computer-implemented method of claim 6, wherein a network interface card (NIC) is configured with the FPGA, gate array, or ASIC.

8. The computer-implemented method of claim 1, wherein the circuit implementation guarantees thread ordering comprising a plurality of threads that enter the circuit implementation in a specified order and exit the circuit implementation in the specified order.

9. A computing system comprising:
one or more processing units; and
a computer-readable storage medium having computer-executable instructions stored thereupon which, when executed by the one or more processing units, cause the computing system to:
store source code expressed in a multi-threaded imperative programming language, the source code comprising a construct that maps to a circuit implementation, the construct comprising a condition statement, and wherein the circuit implementation comprises:
a first hardware pipeline implementing first functionality defined by first instructions located prior to the condition statement in the source code, the first hardware pipeline having an output connected to a queue, and
a second hardware pipeline implementing second functionality defined by second instructions located after the condition statement in the source code and based on the output of the first hardware pipeline, the second hardware pipeline having an input connected to the queue connected to the output of the first hardware pipeline, and wherein the second hardware pipeline processes a value received from the first hardware pipeline by the queue only when the condition statement is evaluated as true;

compile the construct to output a circuit description in a hardware description language (HDL); and generate, based on the circuit description, a synchronous digital circuit comprising the circuit implementation.

10. The computing system of claim 9, wherein the condition statement is evaluated by comparing the value from the queue to a value stored in a register.

11. The computing system of claim 10, wherein the value stored in the register is generated by a third hardware pipeline.

12. The computing system of claim 11, wherein the value from the queue comprises a local variable.

13. The computing system of claim 12, wherein the value stored in the register comprises a global variable.

14. The computing system of claim 9, wherein the synchronous digital circuit is implemented in a field-programmable gate array (FPGA), a gate array, or an application-specific integrated circuit (ASIC).

15. The computing system of claim 14, wherein a network interface card (NIC) is configured with the FPGA, gate array, or ASIC.

16. A computer-readable storage medium having computer-executable instructions stored thereupon which, when executed by one or more processing units, cause a computing system to:
store source code expressed in a multi-threaded imperative programming language, the source code comprising a construct that maps to a circuit implementation, the construct comprising a condition statement, and wherein the circuit implementation comprises:
a first hardware pipeline implementing first functionality defined by first instructions located prior to the condition statement in the source code, the first hardware pipeline having an output connected to a queue, and
a second hardware pipeline implementing second functionality defined by second instructions located after the condition statement in the source code and based on the output of the first hardware pipeline, the second hardware pipeline having an input connected to the queue connected to the output of the first hardware pipeline, and wherein the second hardware pipeline processes a value received from the first hardware pipeline by the queue only when the condition statement is evaluated as true;

compile the construct to output a circuit description in a hardware description language (HDL); and generate, based on the circuit description, a synchronous digital circuit comprising the circuit implementation.

17. The computer-readable storage medium of claim 16, wherein the condition statement is evaluated by comparing the value from the queue to a value stored in a register.

18. The computer-readable storage medium of claim 17, wherein the value stored in the register is generated by a third hardware pipeline.

19. The computer-readable storage medium of claim 18, wherein the value from the queue comprises a local variable.

20. The computer-readable storage medium of claim 19, wherein the value stored in the register comprises a global variable.

* * * * *